United States Patent
Xu et al.

(10) Patent No.: US 10,354,912 B2
(45) Date of Patent: Jul. 16, 2019

(54) FORMING SELF-ALIGNED VERTICAL INTERCONNECT ACCESSES (VIAS) IN INTERCONNECT STRUCTURES FOR INTEGRATED CIRCUITS (ICS)

(71) Applicant: QUALCOMM Incorporated, San Diego, CA (US)

(72) Inventors: Jeffrey Junhao Xu, San Diego, CA (US); John Jianhong Zhu, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/229,535

(22) Filed: Aug. 5, 2016

(65) Prior Publication Data

US 2017/0271202 A1    Sep. 21, 2017

Related U.S. Application Data

(60) Provisional application No. 62/310,951, filed on Mar. 21, 2016.

(51) Int. Cl.
*H01L 23/522* (2006.01)
*H01L 21/768* (2006.01)
*H01L 23/498* (2006.01)

(52) U.S. Cl.
CPC .. *H01L 21/76807* (2013.01); *H01L 21/76831* (2013.01); *H01L 21/76832* (2013.01);
(Continued)

(58) Field of Classification Search
CPC ......... H01L 21/76807; H01L 23/49827; H01L 21/76831; H01L 21/76832; H01L 23/49894; H01L 21/76897; H01L 29/665
See application file for complete search history.

(56) References Cited

U.S. PATENT DOCUMENTS 6,194,316 B1 *   2/2001   Oda ................. H01L 21/288
                                                  257/E21.174
8,669,661 B2    3/2014   Yao et al.
(Continued)

FOREIGN PATENT DOCUMENTS

WO        2013101204 A1    7/2013

OTHER PUBLICATIONS

De Orio, R. L., "1.1 Dual-Damascene Fabrication Process," Electromigration Modeling and Simulation, Jun. 2010, 3 pages, http://www.iue.tuwien.ac.at/phd/orio/node10.html.
(Continued)

*Primary Examiner* — Cuong B Nguyen
*Assistant Examiner* — Samuel Park
(74) *Attorney, Agent, or Firm* — Withrow & Terranova, PLLC

(57) ABSTRACT

Forming self-aligned vertical interconnect accesses (vias) in interconnect structures for integrated circuits (ICs) is disclosed. To reduce or avoid misalignment of a via to an underlying, interconnected metal line, vias are fabricated in the interconnect structure to be self-aligned with an underlying, interconnected metal line. In this regard, underlying metal lines are formed in a dielectric layer. A recess is formed in an underlying metal line below a top surface of an inter-layer dielectric. A stop layer is disposed above the inter-layer dielectric and within the recess of the underlying metal line. The stop layer allows a via tunnel to be formed (e.g., etched) down within the recess of the underlying metal line to self-align the via tunnel with the underlying metal line. A conductive material is then deposited in the via tunnel extending into the recess to form the self-aligned via interconnected to the underlying metal line.

14 Claims, 14 Drawing Sheets

(52) U.S. Cl.
CPC .. *H01L 21/76834* (2013.01); *H01L 21/76883* (2013.01); *H01L 21/76897* (2013.01); *H01L 23/49827* (2013.01); *H01L 23/49894* (2013.01)

(56) References Cited

U.S. PATENT DOCUMENTS

| | | | |
|---|---|---|---|
| 9,054,109 B2 | 6/2015 | Lin et al. | |
| 9,165,883 B2 | 10/2015 | Vannier | |
| 9,269,621 B2 | 2/2016 | Holmes et al. | |
| 9,324,650 B2 | 4/2016 | Edelstein et al. | |
| 2004/0115407 A1* | 6/2004 | Cohen | H01L 21/02126 428/209 |
| 2004/0150012 A1* | 8/2004 | Jin | H01L 21/02126 257/255 |
| 2006/0175708 A1* | 8/2006 | Ueno | H01L 21/76825 257/774 |
| 2009/0017563 A1* | 1/2009 | Jiang | H01L 21/3105 438/4 |
| 2009/0166682 A1* | 7/2009 | Scheuerlein | B82Y 10/00 257/211 |
| 2012/0273958 A1 | 11/2012 | Kim | |
| 2013/0134383 A1* | 5/2013 | Hwang | H01L 45/16 257/5 |
| 2013/0248797 A1* | 9/2013 | Sandhu | H01L 45/04 257/2 |
| 2013/0328208 A1* | 12/2013 | Holmes | H01L 21/76883 257/774 |
| 2015/0091174 A1 | 4/2015 | Clarke et al. | |
| 2015/0130073 A1 | 5/2015 | Sung | |
| 2016/0049364 A1* | 2/2016 | Edelstein | H01L 23/5226 257/774 |

OTHER PUBLICATIONS

International Search Report and Written Opinion for PCT/US2017/022868, dated Jun. 19, 2017, 15 pages.
International Preliminary Report on Patentability for PCT/US2017/022868, dated Jun. 27, 2018, 22 pages.
Second Written Opinion for PCT/US2017/022868, dated Mar. 8, 2018, 7 pages.

* cited by examiner

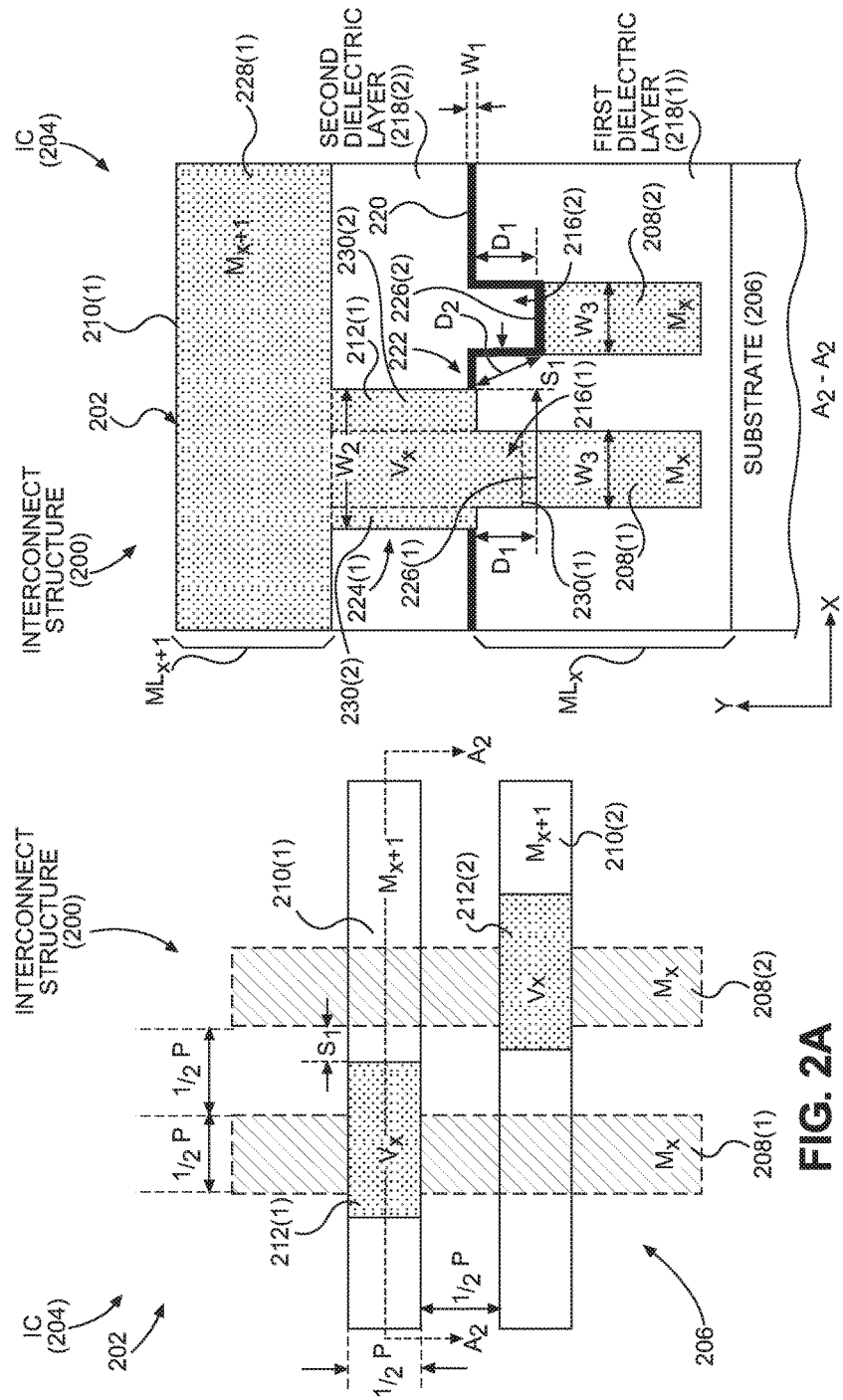

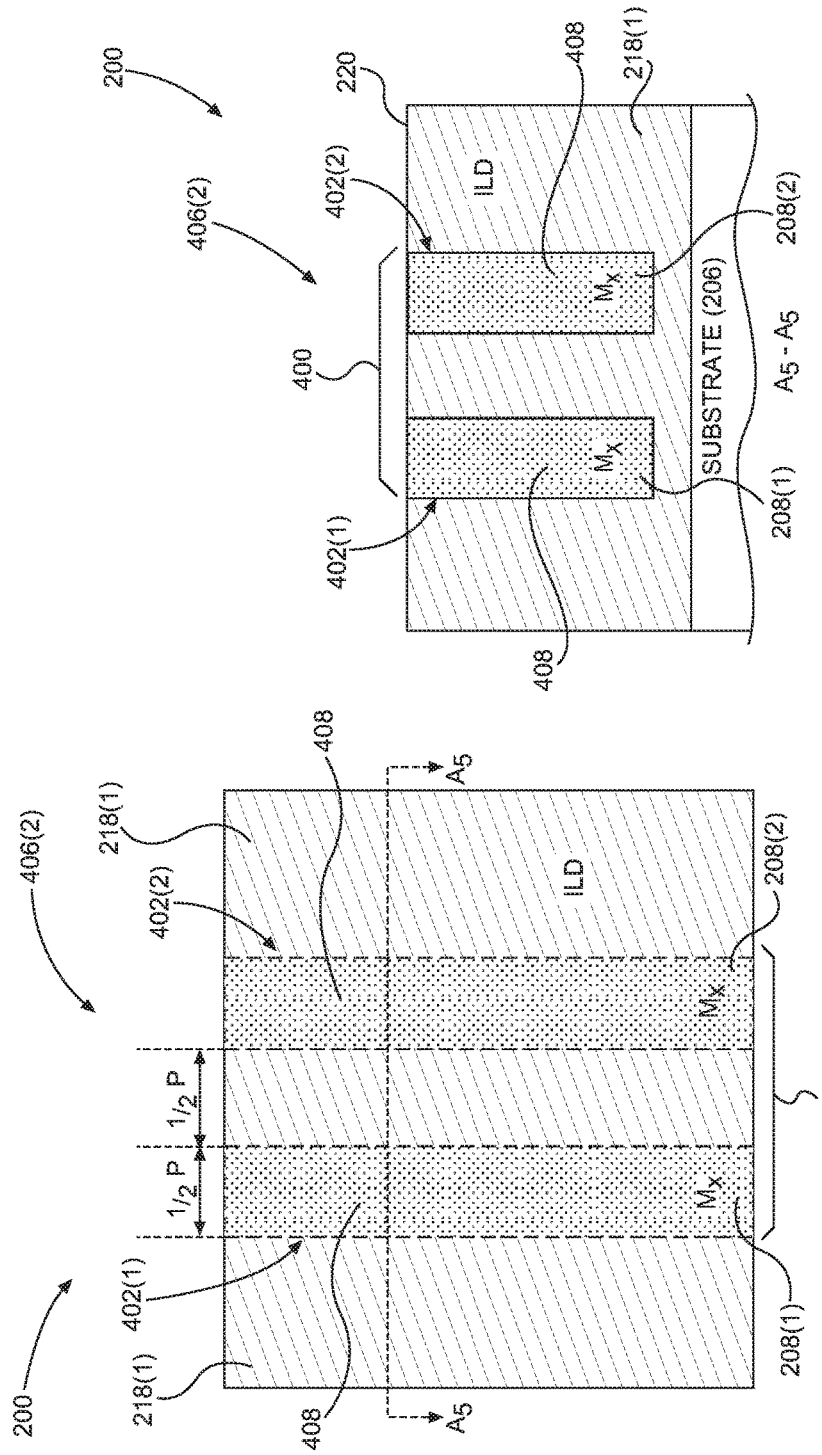

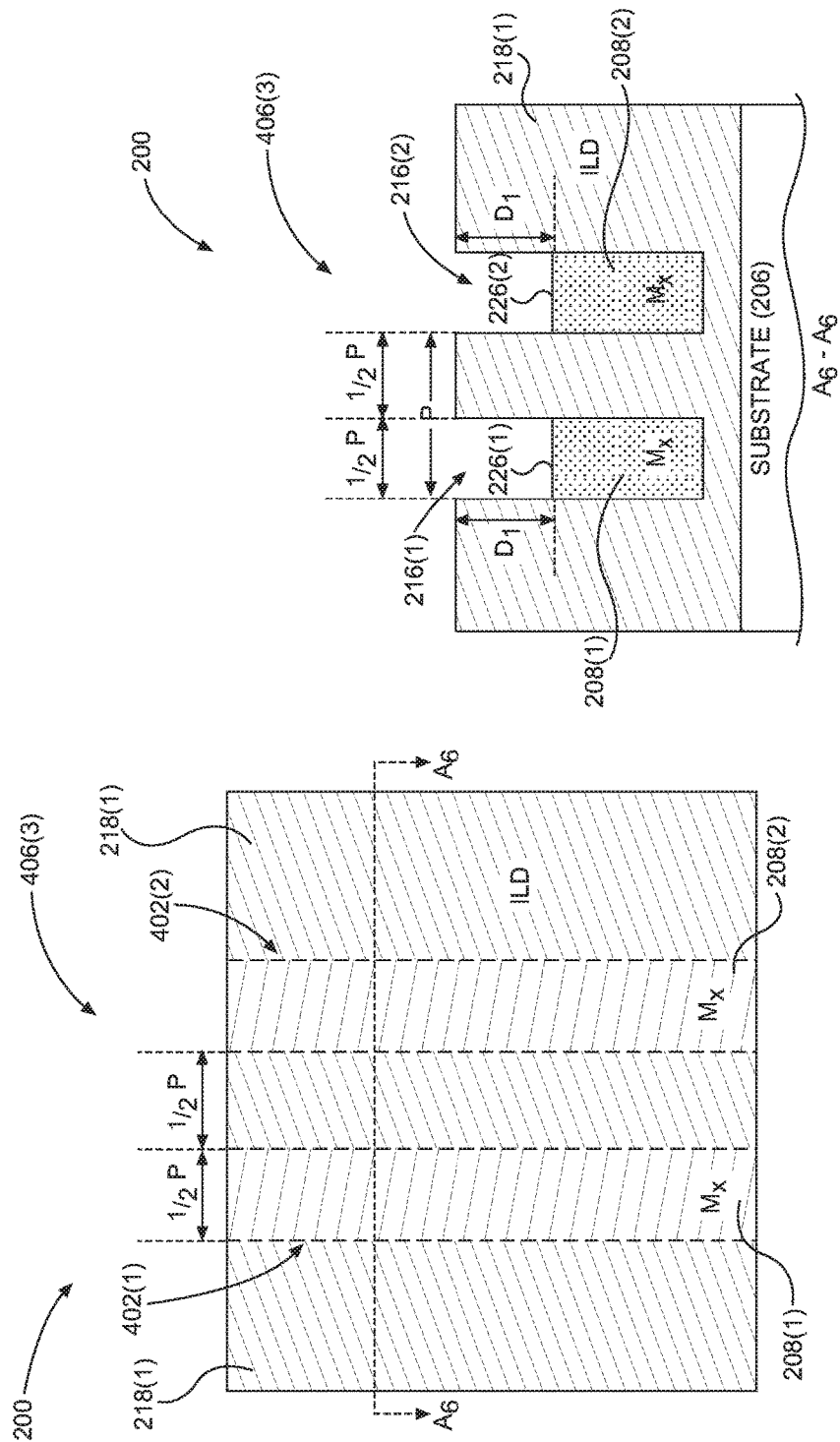

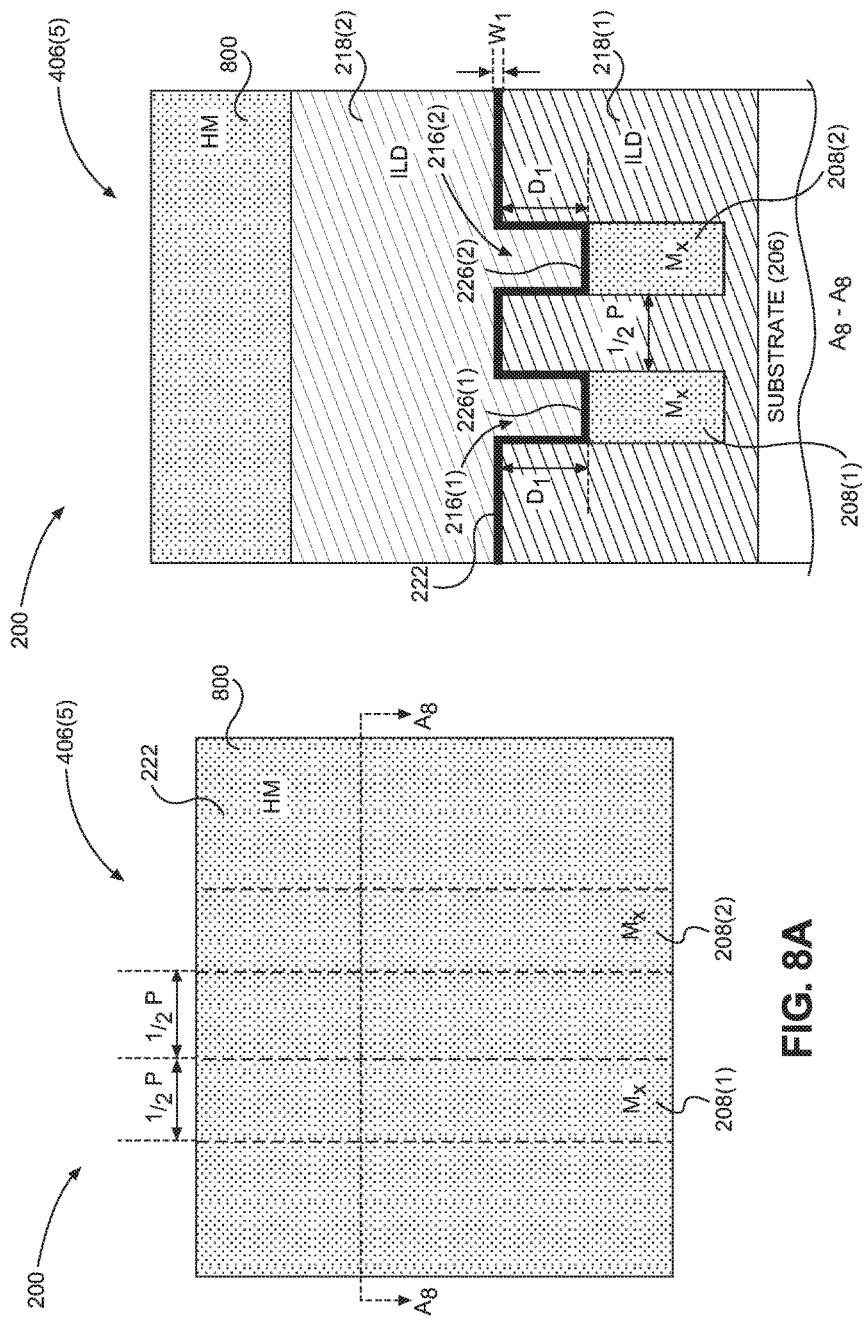

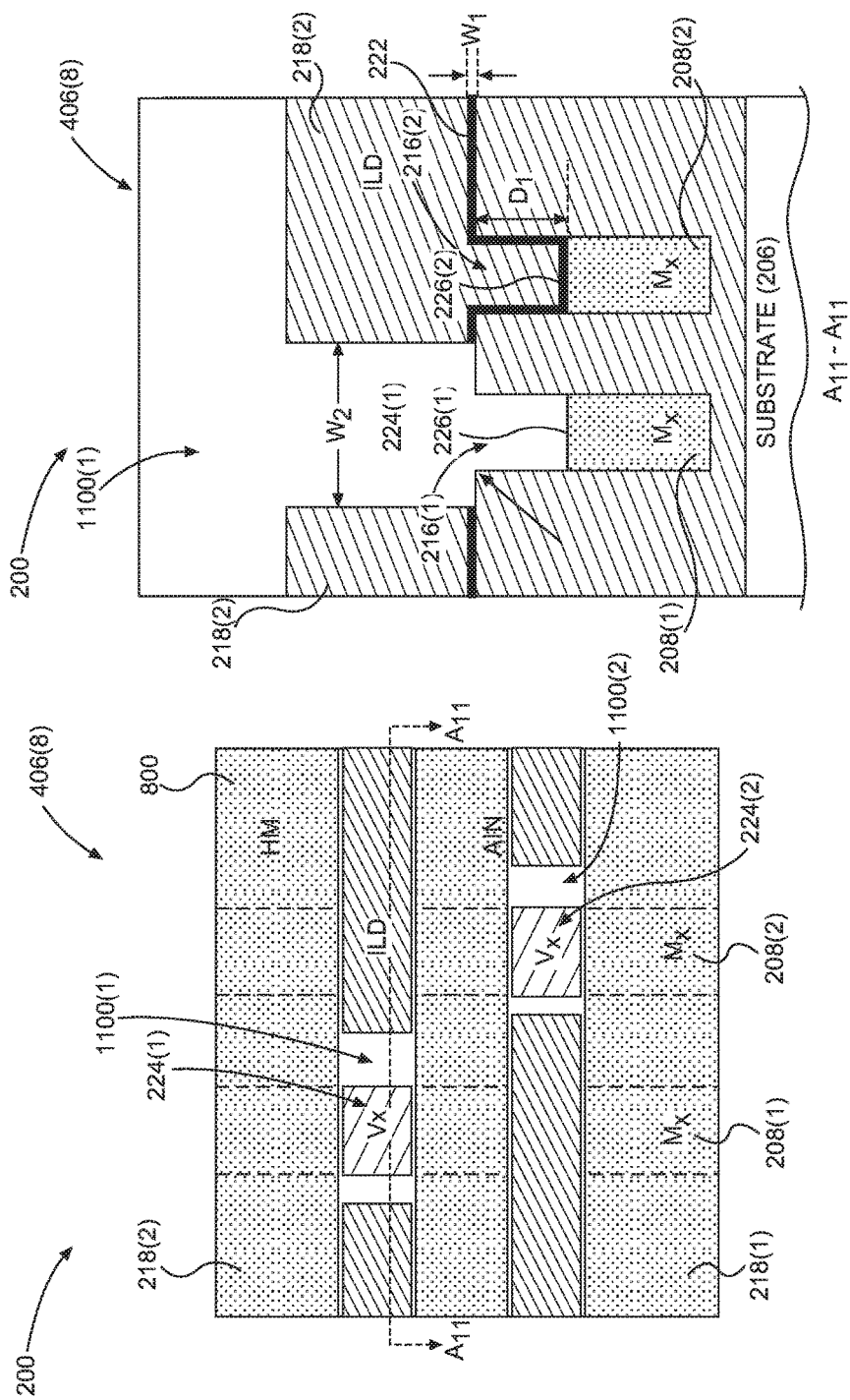

FORMING SELF-ALIGNED VERTICAL INTERCONNECT ACCESSES (VIAS) IN INTERCONNECT STRUCTURES FOR INTEGRATED CIRCUITS (ICS)

PRIORITY APPLICATION

The present application claims priority under 35 U.S.C. § 119(e) to U.S. Provisional Patent Application Ser. No. 62/310,951 filed on Mar. 21, 2016, and entitled "FORMING SELF-ALIGNED VERTICAL INTERCONNECT ACCESSES (VIAs) IN INTERCONNECT STRUCTURES FOR INTEGRATED CIRCUITS (ICs)," the contents of which is incorporated herein by reference in its entirety.

BACKGROUND

I. Field of the Disclosure

The technology of the disclosure relates generally to metal interconnect structures formed in integrated circuits (ICs), and more particularly to forming vertical interconnect accesses (vias) in metal interconnect structures to provide interconnections between metal lines in the metal interconnect structures.

II. Background

Current semiconductor fabrication of integrated circuits (ICs) may include front-end-of-line (FEOL), middle-of-line (MOL), and/or back-end-of-line (BEOL) processes. The FEOL processes may include wafer preparation, isolation, well formation, gate patterning, spacer, extension, and source/drain implantation, silicide formation, and the like. The MOL and/or BEOL processes may include gate contact formation and interconnection among differing layers of the ICs. The BEOL processes also include a series of wafer processing steps for interconnecting semiconductor devices created during the FEOL and MOL processes. Conventional BEOL processes in semiconductor fabrication employ Copper (Cu) interconnects and low dielectric constant (low-K) inter-layer dielectrics (ILDs) to reduce signal delay, cross talk, and power dissipation. These Cu interconnects can be made with a dual damascene process, and comprise vertical interconnect accesses (vias) and trench structures provided in the form of metal line structures. The metal line structures distribute signals within a given interconnect level, also referred to as a metal level or layer. Vias are interconnects that transmit signals between adjacent metal layers.

In this regard, FIG. 1A illustrates a top view of an interconnect structure 100 that can be provided in a semiconductor die 102. FIG. 1B illustrates a cross-sectional side view of the interconnect structure 100 in FIG. 1A along an $A_1$-$A_1$ line. The interconnect structure 100 employs a via $V_X$ to provide interconnections between adjacent upper and lower metal lines $M_{X+1}$ and $M_X$ in a respective upper metal layer $ML_{X+1}$ and lower metal layer $ML_X$. The notation 'X+1' denotes that the upper metal layer $ML_{X+1}$ and upper metal lines $M_{X+1}$ are disposed directly above and adjacent to the lower metal layer $ML_X$ and lower metal lines $M_X$ in this example. The via $V_X$ may be fabricated using a dual damascene process wherein an ILD 104 and the upper metal layer $ML_{X+1}$ are first deposited and patterned using lithography. The upper metal line $M_{X+1}$ and via $V_X$ are created as a result of etching and metal deposition. Thus, the via $V_X$ is aligned to the upper metal layer $ML_{X+1}$ of the interconnect structure 100 as part of the fabrication process, as shown in FIGS. 1A and 1B. The via $V_X$ is offset from the lower metal line $M_X$, which increases via resistance of the via $V_X$. The via $V_X$ being offset from the lower metal line $M_X$ also causes the via $V_X$ to be located a via-metal short distance S away from the adjacent lower metal line $M_{X(N)}$. However, the ILD 104 between the lower metal lines $M_X$, $M_{X(N)}$ provides isolation between the lower metal line $M_{X(N)}$ and the via $V_X$ to avoid an electrical short (i.e., a via-metal short) between the lower metal lines $M_X$, $M_{X(N)}$. The alignment of the via $V_X$ to the lower metal line $M_X$ will vary based on variations in the fabrication process.

If a metal pitch P in the semiconductor die 102 in FIGS. 1A and 1B was scaled down in size, a metal pitch P of the interconnect structure 100 would also be reduced as a result. However, as the metal pitch P of the interconnect structure 100 is reduced, the misalignment of the via Vx with the lower metal line $M_X$ is likely to increase, thus resulting in an increased via $V_X$ resistance. Increased via Vx resistance causes increased signal delay between the metal lines $M_X$, $M_{X+1}$. Further, reducing the metal pitch P of the interconnect structure 100 may further reduce the via-metal short distance S between the via $V_X$ and the adjacent metal line $M_{X(N)}$. The shorter via-metal short distance S may cause the ILD 104 to incur breakdown, creating an electrical short between the lower metal lines $M_X$, $M_{X(N)}$. This may be particularly true for a sub-30 nanometer (nm) metal pitch P of the interconnect structure 100 in FIGS. 1A and 1B. However, there is a desire and need for continued scaling down of device sizes in semiconductor devices, while still providing for an interconnect structure with lower interconnect resistance and sufficient isolation between vias and metal lines to avoid via-metal shorts.

SUMMARY OF THE DISCLOSURE

Aspects of the present disclosure include forming self-aligned vertical interconnect accesses (vias) in interconnect structures for integrated circuits (ICs). These interconnect structures comprise metal lines disposed in layers which are interconnected by vias to provide interconnections to semiconductor devices in an underlying active semiconductor region in a semiconductor die. Via misalignment to an underlying, interconnected metal line affects via resistance, and signal delay in the via as a result. Via misalignment can also cause a via-metal short to an adjacent metal line. To reduce or avoid misalignment of a via providing an interconnection to an underlying, interconnected metal line, aspects disclosed herein provide for fabricated vias in the interconnect structure to be self-aligned with an underlying, interconnected metal line. In this regard, in certain aspects disclosed herein, underlying metal lines are formed in an inter-layer dielectric (ILD) layer. A recess is formed in an underlying metal line below a top surface of the inter-layer dielectric layer. A stop layer is disposed above the inter-layer dielectric layer and within the recess of the underlying metal line. The stop layer allows a via tunnel to be formed (e.g., etched down) within the recess of the underlying metal line to self-align the via tunnel with the underlying metal line. In other words, the recess allows the via tunnel to be disposed and aligned with the underlying metal line to allow the via to be self-aligned with the underlying metal line during fabrication. A conductive material is then deposited in the via tunnel extending into the recess to form the self-aligned via interconnected to the underlying metal line.

In another aspect, it may be desired to form the via tunnel with a larger width than the recess in the underlying metal layer. For example, the self-aligned via can be formed in the via opening such that a first via portion of the self-aligned via extends into the respective recess area of the underlying metal line to be self-aligned with the underlying metal line, while a second via portion of the self-aligned via extends outside of the recess area. This allows the via landing process margin to be relaxed while providing for the via tunnel to fully overlap the recess to fully self-align the via with the underlying metal line. Further, in another aspect, a recess is also formed in an adjacent underlying metal line(s) to the via to increase the distance between the adjacent underlying metal line(s) and the via to reduce the risk of a via-metal short. For example, if the via tunnel has a larger width than its recess in the underlying metal layer, the width of the via above the recess will extend beyond the width of the recess towards an adjacent underlying metal line(s). By recessing the adjacent underlying metal line(s), the distance between the via and the adjacent underlying metal line(s) is increased. This may allow a metal line pitch of the interconnect structure to be further reduced while still avoiding via-metal shorts.

In this regard, in one aspect, an interconnect structure for an IC is provided. The interconnect structure comprises an underlying metal layer. The underlying metal layer comprises a plurality of underlying metal lines disposed in a dielectric layer having a top surface. The underlying metal layer also comprises a recess area of a recess width disposed in the dielectric layer below the top surface of the dielectric layer of a recess distance down to an underlying metal line among the plurality of underlying metal lines. The interconnect structure also comprises an overlying metal layer disposed above the underlying metal layer, the overlying metal layer comprising a plurality of overlying metal lines. The interconnect structure also comprises a self-aligned via of a via opening width disposed between the underlying metal layer and the overlying metal layer and electrically interconnecting the underlying metal line to an overlying metal line among the plurality of overlying metal lines. The self-aligned via comprises a first via portion of the self-aligned via extending into the respective recess area of the underlying metal line to be self-aligned with the underlying metal line. The self-aligned via also comprises a second via portion of the self-aligned via extending outside of the recess area of the via opening width.

In another aspect, an interconnect structure for an IC is provided. The interconnect structure comprises a means for providing an underlying electrical interconnection in an IC. The interconnect structure also comprises a means for providing an overlying electrical interconnection in the IC. The interconnect structure also comprises a means for dielectrically separating the means for providing the underlying electrical interconnection and the means for providing the overlying electrical interconnection. The interconnect structure also comprises a means for providing a recess area of a recess width in the means for providing the underlying electrical interconnection. The interconnect structure also comprises a self-aligned means for providing a first via portion extending into the means for providing the recess area between the means for providing the underlying electrical interconnection and the means for providing the overlying electrical interconnection, and a second via portion extending outside the means for providing the recess area of a via opening width larger than a recess width.

In another aspect, a method of forming a self-aligned via in an interconnect structure for an IC is provided. The method comprises forming a plurality of underlying metal lines of a metal line pitch in a first dielectric layer having a top surface. The method also comprises removing a portion of an underlying metal line among the plurality of underlying metal lines of a recess distance below the top surface of the first dielectric layer to form a recess area of a recess width in the first dielectric layer having a bottom surface adjacent to the underlying metal line. The method also comprises disposing a stop layer on the top surface of the first dielectric layer and on the bottom surface of the recess area. The method also comprises disposing a second dielectric layer above the stop layer and inside the recess area. The method also comprises forming a via opening of a via opening width larger than the recess width aligned with the underlying metal line among the plurality of underlying metal lines, in the second dielectric layer down to the bottom surface of the recess area to the stop layer. The method also comprises filling the via opening and the trench opening with a conductive material down to the bottom surface of the recess area to form a self-aligned via in the trench opening and the via opening, self-aligned with the underlying metal line, such that a first via portion of the self-aligned via extends into the respective recess area of the underlying metal line to be self-aligned with the underlying metal line, and a second via portion of the self-aligned via extends outside of the recess area of the via opening width.

BRIEF DESCRIPTION OF THE FIGURES

FIGS. 2A and 2B are top and cross-sectional side views, respectively, of an interconnect structure that includes a self-aligned via formed within a recess area in a first dielectric layer of a semiconductor die to be aligned and interconnected with an underlying metal line, and interconnecting the underlying metal line with an overlying metal line;

FIGS. 5A and 5B are top and cross-sectional side views, respectively, of a fabrication process of filling patterned trenches to form underlying metal lines in the first dielectric layer of the semiconductor die in FIGS. 4A and 4B;

FIGS. 6A and 6B are top and cross-sectional side views, respectively, of a fabrication process of forming recess areas in the underlying metal lines in the semiconductor die in FIGS. 5A and 5B;

FIGS. 8A and 8B are top and cross-sectional side views, respectively, of a fabrication process of disposing a second dielectric layer onto the stop layer and a hard mask on the second dielectric layer in FIGS. 7A and 7B;

FIGS. 11A and 11B are top and cross-sectional side views, respectively, of a fabrication process of etching the stop layer and removing the photoresist layer and the BARC layer in the semiconductor die in FIGS. 10A and 10B, and forming a trench opening aligned with the via opening;

DETAILED DESCRIPTION

Figures 1A, 1B:
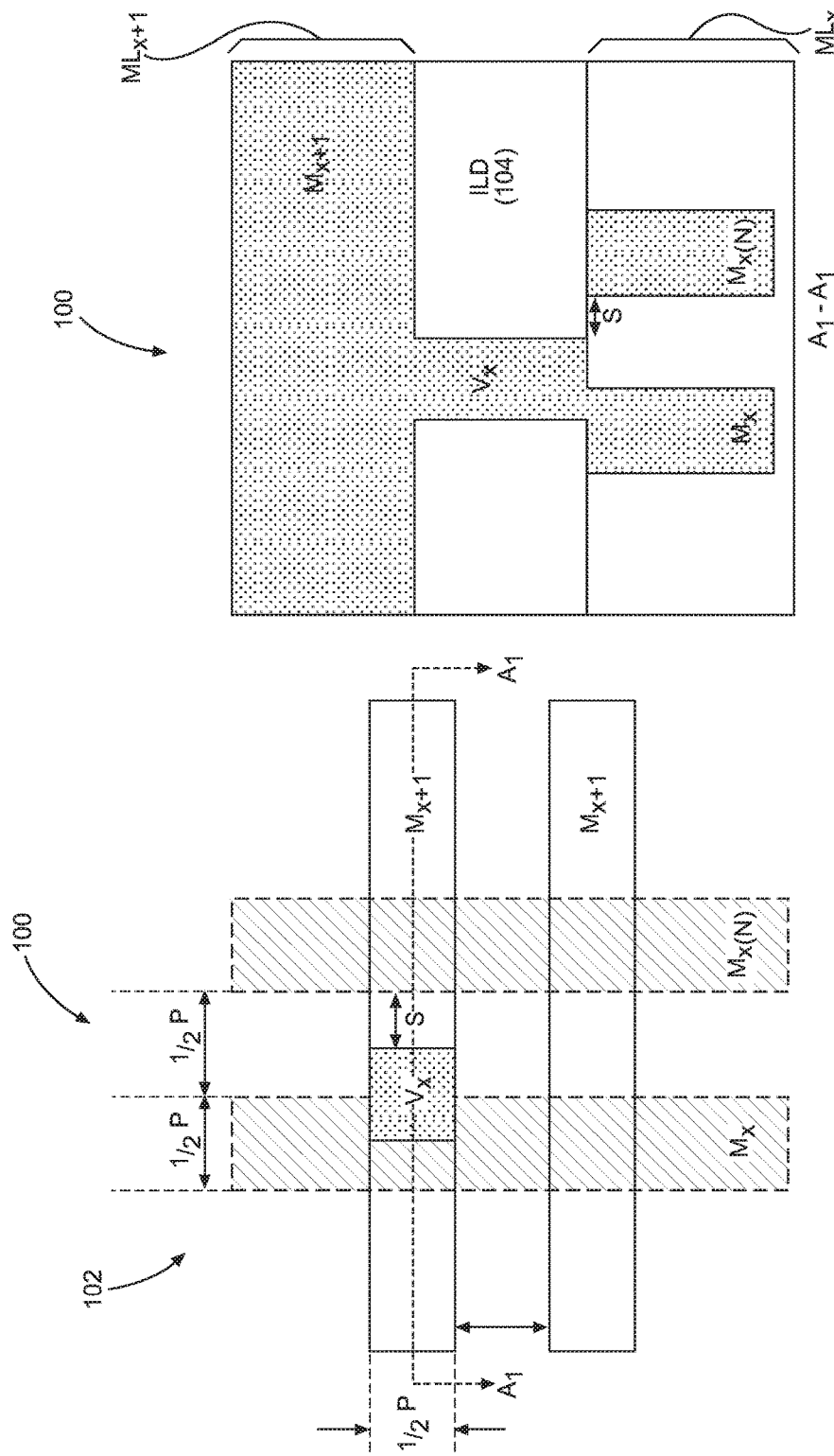
FIGS. 1A and 1B are top and cross-sectional side views, respectively, of a misaligned vertical interconnect access (via) interconnecting an underlying metal line to an overlying metal line in an interconnect structure of a semiconductor die for an integrated circuit (IC)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the present disclosure include forming self-aligned vertical interconnect accesses (vias) in interconnect structures for integrated circuits (ICs). These interconnect structures comprise metal lines disposed in layers which are interconnected by vias to provide interconnections to semiconductor devices in an underlying active semiconductor region in a semiconductor die. Via misalignment to an underlying, interconnected metal line affects via resistance, and signal delay in the via as a result. Via misalignment can also cause a via-metal short to an adjacent metal line. To reduce or avoid misalignment of a via providing an interconnection to an underlying, interconnected metal line, aspects disclosed herein provide for fabricated vias in the interconnect structure to be self-aligned with an underlying, interconnected metal line. In this regard, in certain aspects disclosed herein, underlying metal lines are formed in an inter-layer dielectric (ILD) layer. A recess is formed in an underlying metal line below a top surface of the inter-layer dielectric layer. A stop layer is disposed above the inter-layer dielectric layer and within the recess of the underlying metal line. The stop layer allows a via tunnel to be formed (e.g., etched down) within the recess of the underlying metal line to self-align the via tunnel with the underlying metal line. In other words, the recess allows the via tunnel to be disposed and aligned with the underlying metal line to allow the via to be self-aligned with the underlying metal line during fabrication. A conductive material is then deposited in the via tunnel extending into the recess to form the self-aligned via interconnected to the underlying metal line.

In another aspect, it may be desired to form the via tunnel with a larger width than the recess in the underlying metal layer. For example, the self-aligned via can be formed in the via opening such that a first via portion of the self-aligned via extends into the respective recess area of the underlying metal line to be self-aligned with the underlying metal line, while a second via portion of the self-aligned via extends outside of the recess area. This allows the via landing process margin to be relaxed while providing for the via tunnel to fully overlap the recess to fully self-align the via with the underlying metal line. Further, in another aspect, a recess is also formed in an adjacent underlying metal line(s) to the via to increase the distance between the adjacent underlying metal line(s) and the via to reduce the risk of a via-metal short. For example, if the via tunnel has a larger width than its recess in the underlying metal layer, the width of the via above the recess will extend beyond the width of the recess towards an adjacent underlying metal line(s). By recessing the adjacent underlying metal line(s), the distance between the via and the adjacent underlying metal line(s) is increased. This may allow a metal line pitch of the interconnect structure to be further reduced while still avoiding via-metal shorts.

In this regard, FIGS. 2A and 2B are top and cross-sectional side views, respectively, of an exemplary interconnect structure 200 that includes a self-aligned via for providing interconnects for ICs. The interconnect structure 200 is provided in a semiconductor die 202 (shown in FIG. 2A) that can be included in an IC 204. The interconnect structure 200 is conventionally provided over a substrate 206 and active semiconductor region fabricated as part of a front-end-of-line (FEOL) process. The substrate 206 may be a bulk substrate or a semiconductor-on-insulator (SOI) substrate as examples. The substrate 206 may be formed from a semiconductor material, such as Silicon (Si), or Silicon Germanium (SiGe) as non-limiting examples.

The interconnect structure 200 includes a series of underlying metal lines ($M_X$) 208(1), 208(2) ("underlying metal lines 208(1), 208(2)") and overlying metal lines ($M_{X+1}$) 210(1), 210(2) ("overlying metal lines 210(1), 210(2)") interconnected by self-aligned vias ($V_X$) 212(1), 212(2). The vias 212(1), 212(2) are electrical interconnect structures that provide electrical connections between layers of the interconnect structure 200. The vias 212(1), 212(2) may be through-silicon vias (TSVs) as a non-limiting example. The underlying metal lines ($M_X$) 208(1), 208(2) and overlying metal lines ($M_{X+1}$) 210(1), 210(2) are a means of providing electrical interconnections in the interconnect structure 200 to provide coupling of elements in the IC 204. The underlying metal line 208(1) and adjacent underlying metal line 208(2) and overlying metal lines 210(1), 210(2) are provided of a metal pitch P from each other. The metal pitch P may be under fifty-six (56) nanometers (nm) in the interconnect structure 200, such as twenty-eight (28) nm as an example. The metal pitch P may be reduced as a result of technology scaling to the next nodes in the IC 204. In this example, the underlying metal line 208(1) and adjacent underlying metal line 208(2) are provided that underlie the overlying metal lines 210(1), 210(2). By "overlying," it is meant that the overlying metal lines 210(1), 210(2) are disposed in a metal layer above a metal layer that includes the underlying metal line 208(1) and adjacent underlying metal line 208(2). This is shown in more detail in FIG. 2B, which is a cross-sectional side view of the interconnect structure 200 in FIG. 2A along an $A_2$-$A_2$ line along the overlying metal line 210(1). As shown in FIG. 2B, the underlying metal line 208(1) and adjacent underlying metal line 208(2) are provided in a first, underlying metal layer $ML_X$. The overlying metal lines 210(1), 210(2) are provided in a second, overlying metal layer $ML_{X+1}$ that is disposed above the first, underlying metal layer $ML_X$. Note that although the interconnect structure 200 in FIGS. 2A and 2B only shows the two (2) metal layers $ML_X$, $ML_{X+1}$, the interconnect structure 200 can have additional metal layers that contain metal lines disposed above the overlying metal layer $ML_{X+1}$ and/or below the underlying metal layer $ML_X$.

The self-aligned vias 212(1), 212(2) are provided in the interconnect structure 200 to interconnect the underlying metal line 208(1) and adjacent underlying metal line 208(2) with the respective overlying metal lines 210(1), 210(2). As will be discussed in more detail below, the interconnect structure 200 is fabricated such that the self-aligned vias 212(1), 212(2) are self-aligned with both their respective underlying metal lines 208(1), 208(2) and overlying metal lines 210(1), 210(2). By the self-aligned vias 212(1), 212(2) being aligned to their respective overlying metal lines 210(1), 210(2), the resistance of the interconnect structure 200 is reduced, as opposed to providing misaligned vias to their respective overlying metal lines 210(1), 210(2), to reduce signal delay. However, as also discussed in more detail below, the self-aligned vias 212(1), 212(2) are also self-aligned with their respective underlying metal lines 208(1), 208(2). By also self-aligning the self-aligned vias 212(1), 212(2) to their respective underlying metal lines 208(1), 208(2), the resistance of the interconnect structure 200 is reduced, as opposed to providing misaligned vias to their respective underlying metal lines 208(1), 208(2), to reduce signal delay. Also, by self-aligning the self-aligned vias 212(1), 212(2) to their respective underlying metal lines 208(1), 208(2), risk of misalignment issues causing the self-aligned vias 212(1), 212(2) to be fabricated a distance short enough to cause a via-metal short with an adjacent underlying metal line 208(1), 208(2) is reduced.

The cross-sectional view of the interconnect structure 200 in FIG. 2B illustrates more detail on how the self-aligned via 212(1) is fabricated to be self-aligned with its respective underlying metal line 208(1) and overlying metal line 210(1). The discussion of the self-aligned via 212(1) in FIG. 2B is also applicable to the self-aligned via 212(2). To self-align the self-aligned via 212(1) to the underlying metal line 208(1), the self-aligned via 212(1) is formed down within a recess area 216(1) in a respective first dielectric layer 218(1) in the underlying metal layer $ML_X$. The first dielectric layer 218(1) in this example is an inter-layer dielectric (ILD) layer that is a low-k dielectric layer, for example having a dielectric constant (k value) lower than about 3.0 as a non-limiting example. As will be described in more detail below, the recess area 216(1) was previously formed by removal of a portion of the underlying metal line 208(1) below a top surface 220 of the first dielectric layer 218(1) of a recess distance $D_1$. A stop layer 222 of width $W_1$ was then disposed on the top surface 220 of the first dielectric layer 218(1). The stop layer 222 is also disposed into the recess area 216(1) onto a bottom surface 226(1) of the recess area 216(1) to provide a stop in the recess area 216(1) adjacent to the underlying metal line 208(1). For example, the stop layer 222 may be an etch stop layer that provides an etch stop in the recess area 216(1). A second dielectric layer 218(2) is disposed above the stop layer 222 in the overlying metal layer $ML_{X+1}$. A via opening 224(1) of a via opening width $W_2$ is subsequently removed (e.g., etched) down through the second dielectric layer 218(2) to the stop layer 222 and down to the bottom surface 226(1) of the recess area 216(1) to self-align the via opening 224(1) to the underlying metal line 208(1). In this manner, a conductive material can then be disposed in the via opening 224(1), which is aligned with the underlying metal line 208(1), to provide the self-aligned via 212(1) self-aligned with and interconnected to the underlying metal line 208(1).

With continuing reference FIG. 2B, the self-aligned via 212(1) is also self-aligned with the overlying metal line 210(1). As will be discussed in more detail below, the alignment of the self-aligned via 212(1) with the overlying metal line 210(1) is formed by providing a trench 228(1) in the overlying metal line 210(1) above the via opening 224(1) such that the trench 228(1) is aligned with the via opening 224(1). Thereafter, the self-aligned via 212(1) is formed by a conductive material being disposed in both the trench 228(1) and the via opening 224(1) such that the self-aligned via 212(1) will also be self-aligned with the overlying metal line 210(1).

Thus, the self-aligned via 212(1) formed in the via opening 224(1) that is aligned with both the underlying metal line 208(1) and the overlying metal line 210(1) is also self-aligned with and interconnects both the underlying metal line 208(1) and the overlying metal line 210(1). Providing the self-aligned via 212(1) that can self-align with the underlying metal line 208(1) as part of its fabrication process may become increasingly important to avoid unacceptable increases in via resistance and resulting signal delay, and risk of via-metal shorts. Providing the recess area 216(1) to align the via opening 224(1) to self-align the self-aligned via 212(1) allows more precise control and alignment of the self-aligned via 212(1) to the underlying metal line 208(1). Via to metal line alignment may be particularly critical at small metal pitches P, such as five (5) nm and below for example, where an interconnected metal line is more closely located to adjacent metal lines where misalignment of the vias Vx can cause a via-metal short.

The underlying metal line 208(1) and adjacent underlying metal line 208(2) and overlying metal lines 210(1), 210(2) may be made from any conductive material desired, including but not limited to Copper (Cu), Tungsten (W), Cobalt (Co), Ruthenium (Ru), Aluminum (Al), or a hybrid or alloy thereof. However, non-Copper (Cu) metals such as Cobalt (Co), Ruthenium (Ru), and Aluminum (Al) for example may be advantageous to be used as they are easier materials to be etched back, and are better able to be filled in a high aspect ratio via opening 224(1) and trench 228(1) as part of a fabrication process of forming the self-aligned vias 212(1), 212(2) and the portion of their respective overlying metal lines 210(1), 210(2) interconnected and aligned with the self-aligned vias 212(1), 212(2).

Further, as shown in FIG. 2B, in this example, the via opening width $W_2$ of the via opening 224(1) can be formed to be larger than a recess width $W_3$ of the recess areas 216(1), 216(2). In this manner, the self-aligned via 212(1) can be provided to extend beyond and outside the recess width $W_3$ of the recess area 216(1). A first via portion 230(1) of the self-aligned via 212(1) extends into the recess area 216(1) of the underlying metal line 208(1) to electrically interconnect the underlying metal line 208(1) to the overlying metal line 210(1). A second via portion 230(2) of the self-aligned via 212(1) extends outside of the recess area 216(1). This structure can provide for improved alignment of the self-aligned via 212(1) to the underlying metal line 208(1), because a greater tolerance is provided for fully disposing the self-aligned via 212(1) in the recess area 216(1) to provide contact with the top surface of the underlying metal line 208(1) given variations that may occur in the fabrication process. Thus, the fabrication process of disposing the self-aligned via 212(1) in the recess area 216(1) may be relaxed. However, extending the via opening 224(1) to the via opening width $W_2$ beyond the recess width $W_3$ of the recess area 216(1) can place the self-aligned via 212(1) formed in the recess area 216(1) closer to an adjacent underlying metal line 208(2). This can risk creating a via-metal short between the self-aligned via 212(1) and the adjacent underlying metal line 208(2).

Figure 3A:
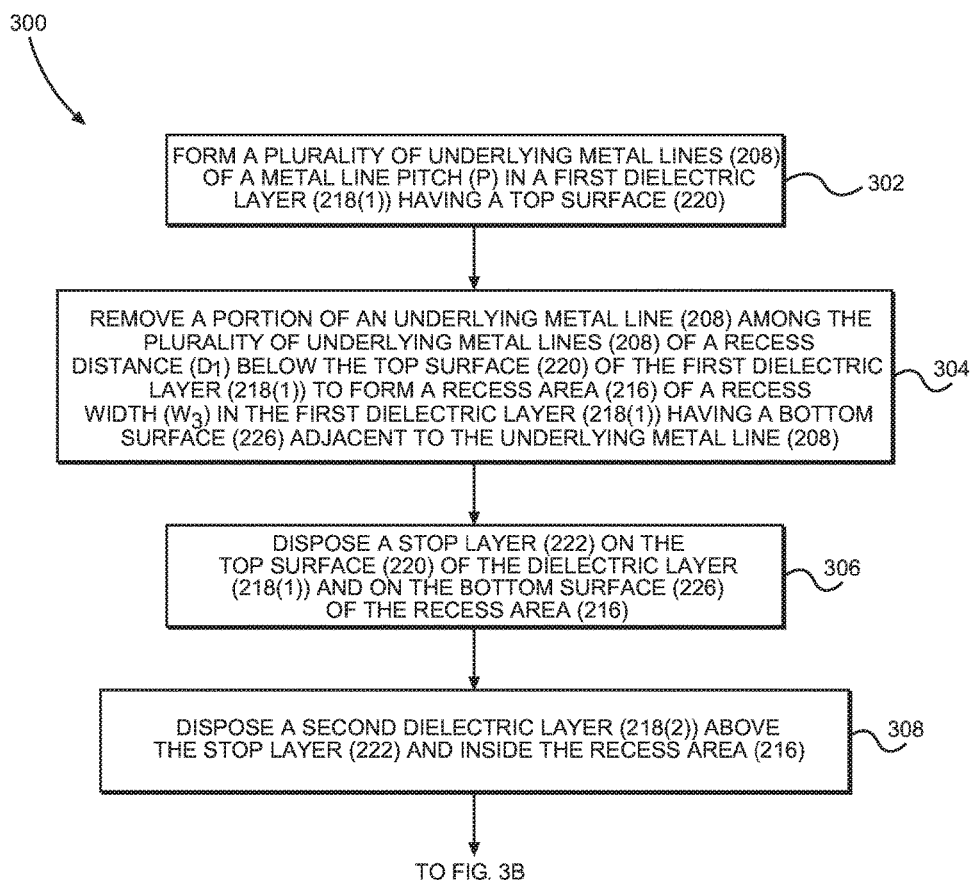
FIGS. 3A and 3B are flowcharts illustrating an exemplary process of fabricating a self-aligned via aligned to an underlying metal line of the interconnect structure in FIGS. 2A and 2B, to interconnect the underlying metal line to an overlying metal line.
Figure 3B:
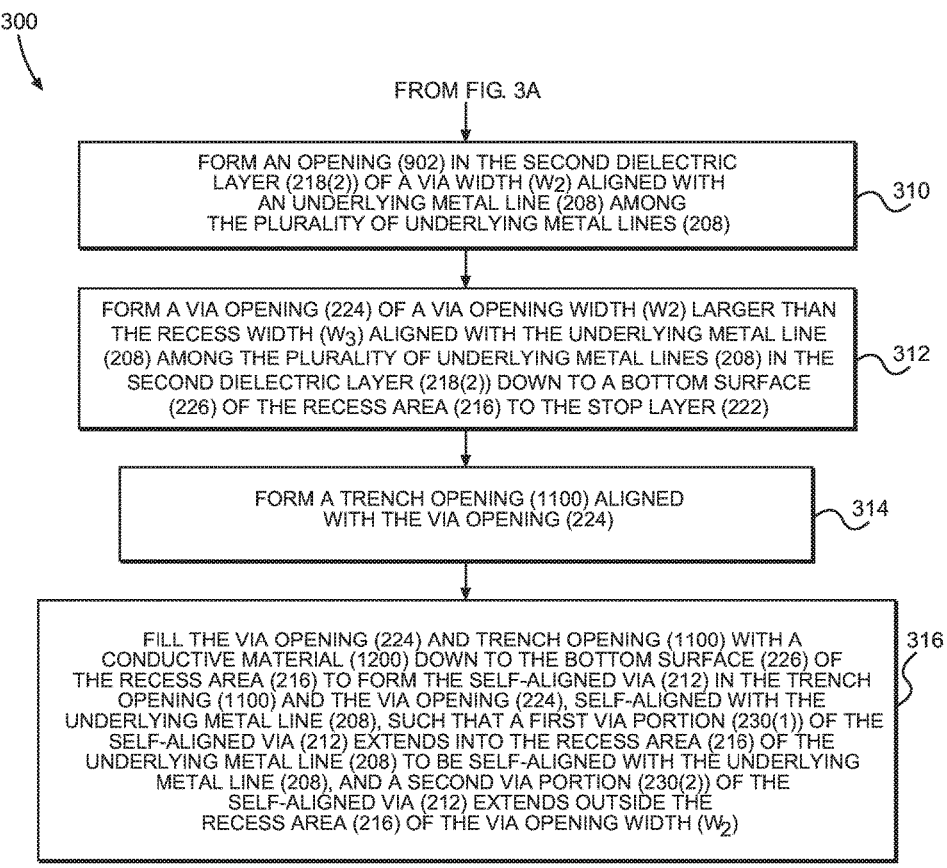

In this regard, as further shown in FIG. 2B, in this example, an adjacent recess area 216(2) is formed in an adjacent underlying metal line 208(2) adjacent to the underlying metal line 208(1) to reduce the risk of a via-metal short between the self-aligned via 212(1) and the adjacent underlying metal line 208(2). As shown in FIG. 2B, providing the adjacent recess area 216(2) in the adjacent underlying metal line 208(2) provides a greater distance $D_2$ between the self-aligned via 212(1) and the adjacent underlying metal line 208(2) than if the adjacent recess area 216(2) were not created in the adjacent underlying metal line 208(2). For example, the recess width $W_3$ of the adjacent recess area 216(2) is the same as the recess width $W_3$ of the recess area 216(1) in this example, but such is not required. This may be particularly important to scale down the metal pitch P in an interconnect structure, such as the interconnect structure 200, beyond a five (5) nm technology node for example, where the interconnected metal lines are more closely located to adjacent metal lines where slight misalignment of the vias can cause via-metal shorts. This may allow the metal pitch P of the interconnect structure 200 to be further reduced without risking via-metal shorts. A lateral distance $S_1$ between the self-aligned via 212(1) and the adjacent underlying metal line 208(2) is no longer the controlling distance between the self-aligned via 212(1) and the adjacent underlying metal line 208(2) for a via-metal short. Providing the adjacent recess area 216(2) in the adjacent underlying metal line 208(2) may also allow the landing alignment margin of the via opening 224(1) to be relaxed during the fabrication process. FIGS. 3A and 3B describe an exemplary fabrication process 300 of fabricating the interconnect structure 200 and the self-aligned via 212(1) that is self-aligned to and interconnected between a respective underlying metal line 208(1) and overlying metal line 210(1) of the interconnect structure 200 in FIGS. 2A and 2B. The process steps in the fabrication process 300 in FIGS. 3A and 3B are illustrated respectively in FIGS. 4A-12B. FIGS. 4A-12B will be referenced as the exemplary fabrication steps in the fabrication process 300 in FIGS. 3A and 3B as described below.

Figure 4B:
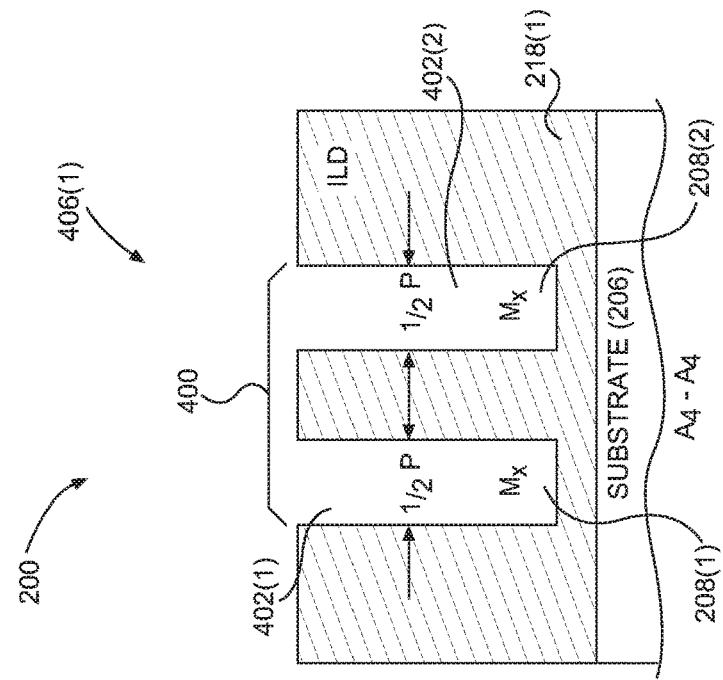
FIGS. 4A and 4B are top and cross-sectional side views, respectively, of a fabrication process of patterning trenches for metal lines at a desired metal line pitch in a first dielectric layer of a semiconductor die for an interconnect structure in an IC.
Figure 4A:
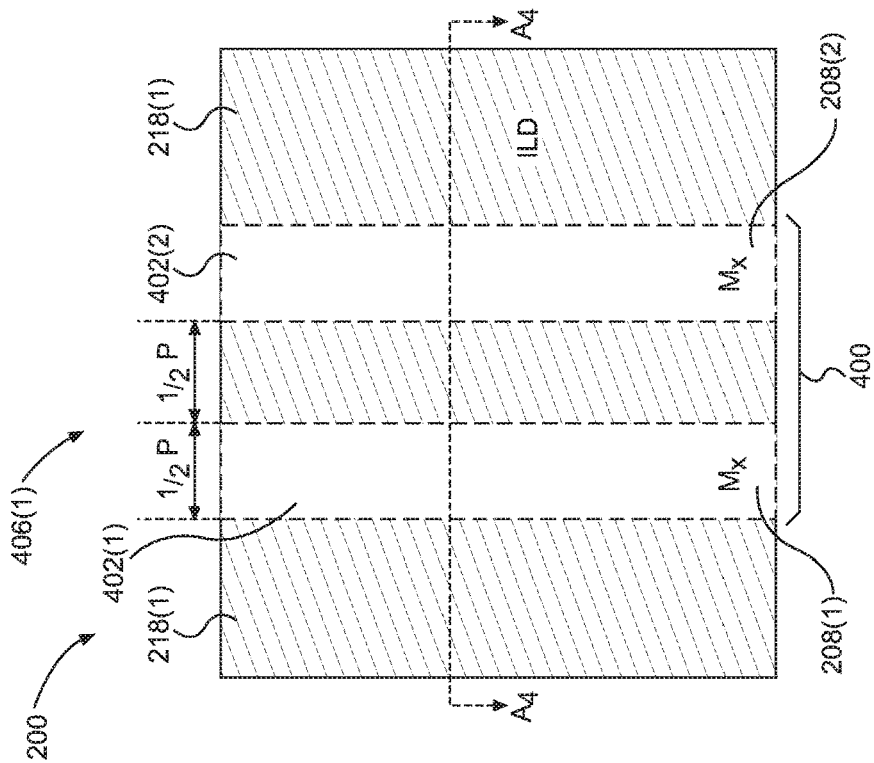

In this regard, a first step to fabricate the interconnect structure 200 in FIGS. 2A and 2B is to form a plurality of the underlying metal line 208(1) and adjacent underlying metal line 208(2) of a metal line pitch P in the first dielectric layer 218(1) having a top surface 220 (block 302 in FIG. 3A). A first exemplary step to form the plurality of underlying metal lines 208(1), 208(2) is to form a patterning 400 of trenches 402(1), 402(2) in the first dielectric layer 218(1) for forming the underlying metal line 208(1) and adjacent underlying metal line 208(2), as shown in FIGS. 4A and 4B. FIG. 4A is a top view of a semiconductor die 406(1) for the interconnect structure 200 illustrating the first dielectric layer 218(1) disposed on the substrate 206. The patterning 400 of the trenches 402(1), 402(2) is formed in the first dielectric layer 218(1) of the semiconductor die 406(1) of a metal pitch P for forming the underlying metal line 208(1) and adjacent underlying metal line 208(2). FIG. 4B is a cross-sectional side view along line $A_4$-$A_4$ in FIG. 4A of the patterning 400 of the trenches 402(1), 402(2) formed in the first dielectric layer 218(1) of the metal pitch P for forming the underlying metal line 208(1) and adjacent underlying metal line 208(2). For example, the patterning 400 of the trenches 402(1), 402(2) may be formed in the first dielectric layer 218(1) with a self-aligned quadruple patterning (SAQP) process. As another example, the plurality of trenches 402(1), 402(2) may also be formed with an extreme ultraviolet (UV) (EUV) lithography single exposure.

A next exemplary fabrication step to form the plurality of underlying metal lines 208(1), 208(2) in the semiconductor die 406(1) in FIGS. 4A and 4B (block 302 in FIG. 3A) is to form the underlying metal line 208(1) and adjacent underlying metal line 208(2) in the respective trenches 402(1), 402(2). This is shown in FIGS. 5A and 5B. FIG. 5A is a top view of a next stage semiconductor die 406(2) of the semiconductor die 406(1) in FIGS. 4A and 4B, with the trenches 402(1), 402(2) of metal pitch P filled with a conductive material 408 to form the underlying metal line 208(1) and adjacent underlying metal line 208(2) in the first dielectric layer 218(1) disposed on the substrate 206 of the interconnect structure 200. FIG. 5B is a cross-sectional side view along line $A_5$-$A_5$ in FIG. 5A of the underlying metal line 208(1) and adjacent underlying metal line 208(2) of the conductive material 408 formed in the trenches 402(1), 402(2) formed in the first dielectric layer 218(1). For example, the underlying metal line 208(1) and adjacent underlying metal line 208(2) formed in the trenches 402(1), 402(2) may be formed with a dual damascene fill process. The underlying metal line 208(1) and adjacent underlying metal line 208(2) may be made from any conductive material 408 desired, including but not limited to Copper (Cu), Tungsten (W), Cobalt (Co), Ruthenium (Ru), Aluminum (Al), or a hybrid or alloy thereof. However, as discussed above, non-Copper (Cu) metals such as Cobalt (Co), Ruthenium (Ru), and Aluminum (Al) as examples, may be advantageous to be used as they are easier materials to be etched back, and are better able to be filled in the high aspect ratio via opening 224(1) and the trench 228(1). The portion of the conductive material 408 that is residual beyond the top surface 220 of the first dielectric layer 218(1) can be polished down to the top surface 220, such as through a chemical mechanical polishing or planarization (CMP) process.

FIG. 6A is a top view of a next stage semiconductor die 406(3) of the interconnect structure 200 to illustrate a fabrication process step of forming the recess area 216(1) and adjacent recess area 216(2) in the underlying metal line 208(1) and adjacent underlying metal line 208(2) in the semiconductor die 406(2) in FIGS. 5A and 5B (block 304 in FIG. 3A). FIG. 6B is a cross-sectional side view of the next stage semiconductor die 406(3) along the cross-section $A_6$-$A_6$ line in FIG. 6A. The recess area 216(1) and adjacent recess area 216(2) are formed by removal of a portion of the underlying metal line 208(1), 208(2) below the top surface 220 of the first dielectric layer 218(1) of a recess distance $D_1$. For example, an etching process may be employed to remove a portion of the underlying metal line 208(1), 208(2) below the top surface 220 of the first dielectric layer 218(1) of a recess distance $D_1$. The recess area 216(1) and adjacent to recess area 216(2) are disposed the recess distance $D_1$ into the respective underlying metal lines 208(1), 208(2) to form respective bottom surfaces 226(1), 226(2) that are adjacent or formed by a top surface of the residual underlying metal lines 208(1), 208(2). As discussed above, forming the recess area 216(1) and adjacent recess area 216(2) in the underlying metal line 208(1) and adjacent underlying metal line 208(2) allows a respective via opening 224(1) and adjacent via opening 224(2) (see FIG. 2B) to be etched down into the recess area 216(1) and adjacent recess area 216(2) to align the via opening 224(1) and adjacent via opening 224(2) to the respective underlying metal lines 208(1), 208(2). As will be discussed below, this allows a self-aligned via 212(1), 212(2) to be formed in the via opening 224(1) and adjacent via opening 224(2), and thus self-aligned with the respective underlying metal lines 208(1), 208(2).

In the example in FIGS. 6A and 6B, the recess area 216(1) and adjacent recess area 216(2) are formed a distance $D_1$ of at least approximately one-half (½) the metal pitch P of the underlying metal line 208(1) and adjacent underlying metal line 208(2) as a non-limiting example. As discussed above with regard to FIG. 2B, providing the recess area 216(1) and adjacent recess area 216(2) in the underlying metal line 208(1), 208(2) can provide a greater distance between a respective self-aligned via 212(1), 212(2) and an adjacent underlying metal line 208(2), 208(1) than if the recess area 216(1), 216(2) were not created in the adjacent underlying metal line 208(1), 208(2). This may allow the metal pitch P of the interconnect structure 200 to be further reduced without risking via-metal shorts between later-formed self-aligned vias 212(1), 212(2) and respective, adjacent underlying metal lines 208(1), 208(2).

Figures 7A, 7B:
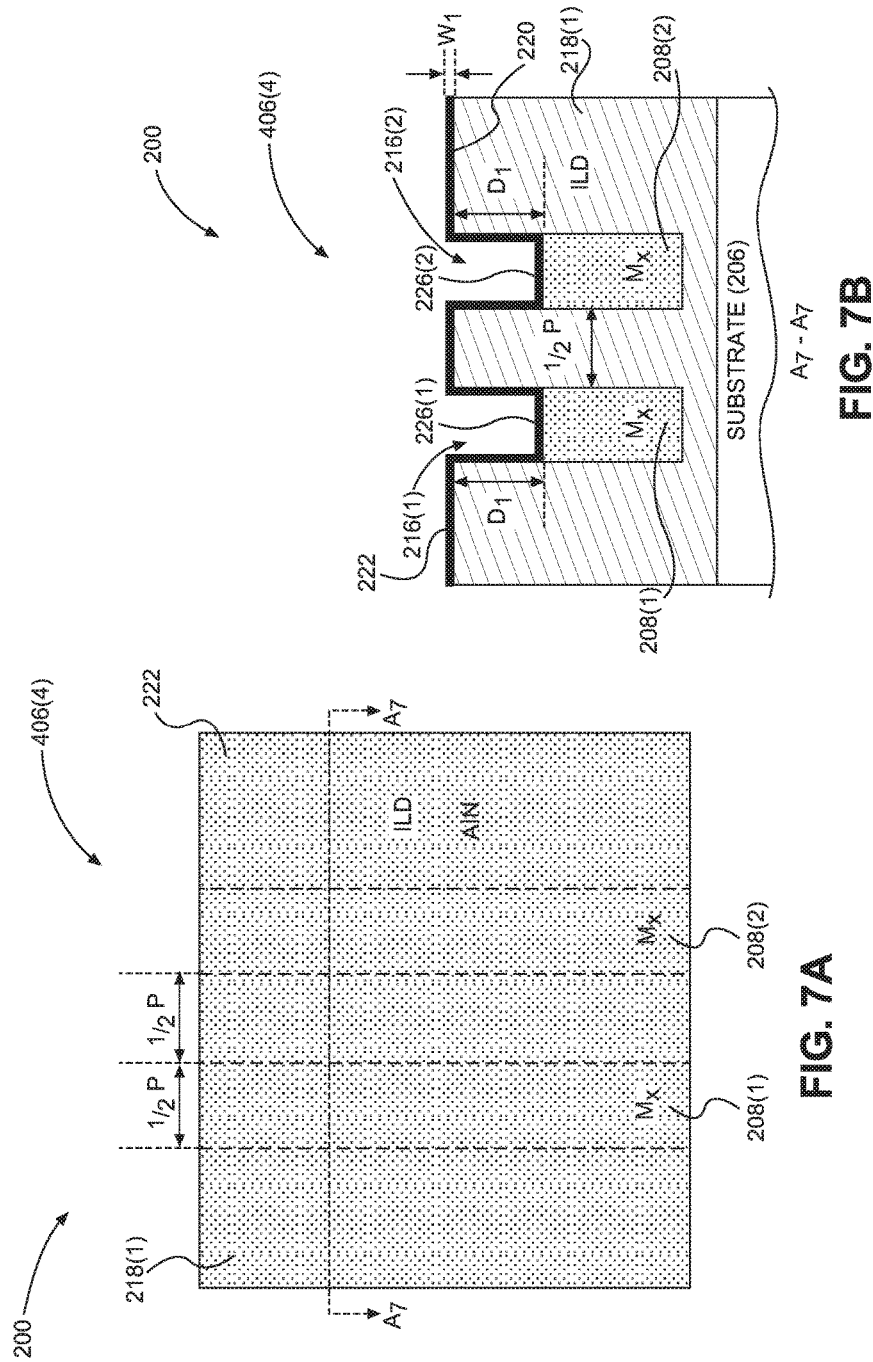
FIGS. 7A and 7B are top and cross-sectional side views, respectively, of a fabrication process of disposing a stop layer on a top surface of the first dielectric layer and within the recess areas in the underlying metal lines in the semiconductor die in FIGS. 6A and 6B.

To provide for a via opening 224(1), 224(2) (FIG. 2B) to later be etched down to the first dielectric layer 218(1) and the bottom surfaces 226(1), 226(2) of the respective recess areas 216(1), 216(2) during a later fabrication process step, the stop layer 222 is disposed as shown in FIGS. 7A and 7B. FIG. 7A is a top view of a next stage semiconductor die 406(4) of the interconnect structure 200 illustrating a next fabrication process step of disposing the stop layer 222 onto the top surface 220 of the first dielectric layer 218(1) and onto the bottom surfaces 226(1), 226(2) of the respective recess area 216(1), 216(2) (block 306 in FIG. 3A). For example, the stop layer 222 may be deposited onto the top surface 220 of the first dielectric layer 218(1) and onto the bottom surfaces 226(1), 226(2) of the respective recess area 216(1), 216(2) in a depositing process. FIG. 7B is a cross-sectional side view of the next stage semiconductor die 406(4) along the $A_7$-$A_7$ line. The stop layer 222 may also be disposed on the sides of the recess area 216(1) and adjacent recess area 216(2). The stop layer 222 is a thin layer of width $W_1$. The width $W_1$ of the stop layer 222 may be two (2) nm or less as an example. The stop layer 222 may be formed from a semiconductor material, such as Aluminum Nitride (AlN) for example.

Next, in the exemplary fabrication process 300 in FIGS. 3A and 3B, the second dielectric layer 218(2) is disposed above the first dielectric layer 218(1) and above the stop layer 222 (block 308 in FIG. 3A). This is shown in a next stage semiconductor die 406(5) in FIGS. 8A and 8B. FIG. 8A is a top view of the next stage semiconductor die 406(5) of the interconnect structure 200 after performing additional fabrication steps on the semiconductor die 406(4) in FIGS. 7A and 7B. FIG. 8B is a cross-sectional side view of the next stage semiconductor die 406(5) in FIG. 8A along the $A_8$-$A_8$ line in FIG. 8A. As shown in FIGS. 8A and 8B, a hard mask (HM) 800, which may be a metal hard mask, is also optionally formed over the second dielectric layer 218(2). The hard mask 800 can then be patterned and etched in a subsequent fabrication step to form the overlying metal lines 210(1), 210(2) of the interconnect structure 200 (see FIG. 2A).

Figure 9B:
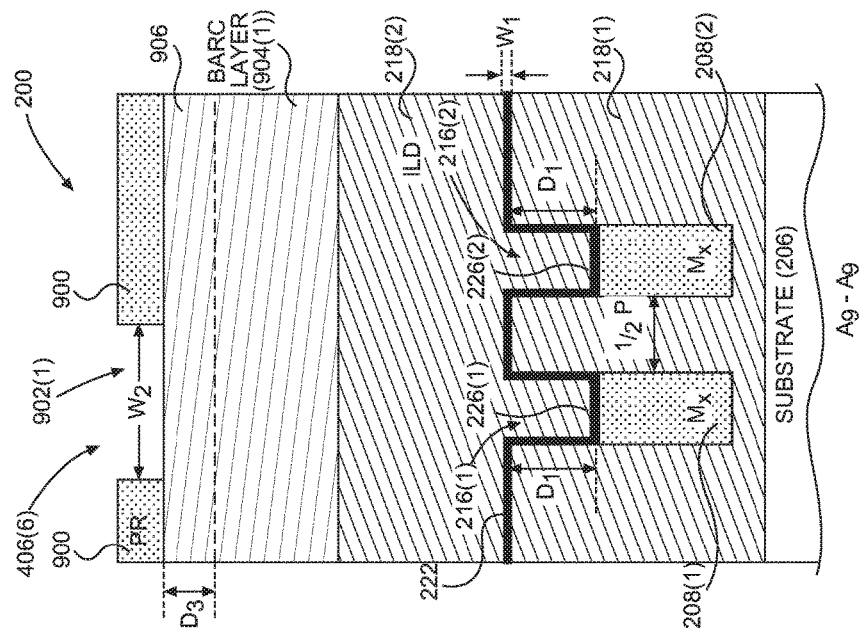
FIGS. 9A and 9B are top and cross-sectional side views, respectively, of a fabrication process of optionally disposing a bottom anti-reflective coating (BARC) layer on the hard mask in FIGS. 8A and 8B, and disposing a photoresist layer, followed by a self-aligned via patterning of a via opening in the photoresist layer.
Figure 9A:
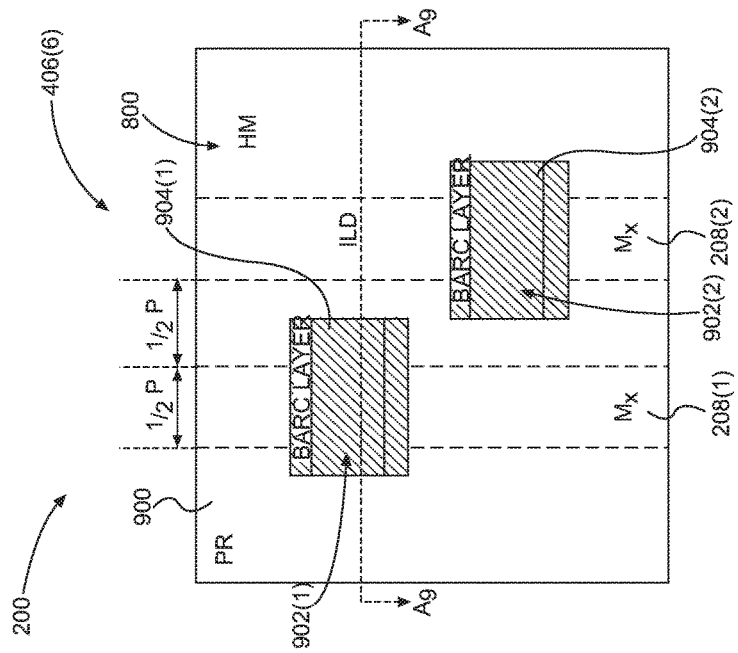

FIG. 9A is a top view of a next stage semiconductor die 406(6) of the interconnect structure 200 of a next fabrication process performed on the semiconductor die 406(5) in FIGS. 8A and 8B of preparing to provide a via opening 224(1) (FIG. 2B). FIG. 9B is a side cross-sectional view of the semiconductor die 406(6) in FIG. 9A along the $A_9$-$A_9$ line in FIG. 9A. As previously discussed, the via opening 224(1) (FIG. 2B) facilitates fabrication of a self-aligned via 212(1) to the overlying metal line 210(1) and underlying metal line 208(1) of the interconnect structure 200. As illustrated in FIGS. 9A and 9B, a photoresist layer (PR) 900 may optionally be provided above the second dielectric layer 218(2) to be exposed and used to form the via opening 224(1) and adjacent via opening 224(2).

In this regard, openings 902(1), 902(2) of the via opening width $W_2$ are first formed in this example for a subsequent step of forming the via opening 224(1), 224(2) aligned with a respective underlying metal line 208(1), 208(2) (block 310 in FIG. 3B). For example, as shown in FIG. 9B, the photoresist layer 900 can be disposed above the hard mask 800 to form the openings 902(1), 902(2) of the via opening width $W_2$. For example, the photoresist layer 900 may be deposited above the hard mask 800 to form the openings 902(1), 902(2) of the via opening width $W_2$ in a depositing process. In this example, the openings 902(1), 902(2) are formed as a result of exposing the photoresist layer 900 in an exposure process. As discussed in more detail below, the openings 902(1), 902(2) are formed for the subsequent step of forming the via opening 224(1) and adjacent via opening 224(2) aligned with a respective underlying metal line 208(1), 208(2). As shown in FIG. 9B, with regard to underlying metal line 208(1) in particular as an example, the via opening 224(1) is aligned over the recess area 216(1) into which the self-aligned via 212(1) (FIG. 2B) will be formed, to be aligned with the underlying metal line 208(1).

Further, because the hard mask 800 is patterned and thus not flat in this example, a bottom anti-reflective coating (BARC) layer 904(1), 904(2) can optionally be disposed over the hard mask 800 before the photoresist layer 900 is disposed, as shown in FIGS. 9A and 9B. A BARC layer 904(1) is disposed (e.g., deposited) over the second dielectric layer 218(2) to provide a substantially flat surface for disposing the photoresist layer 900 and performing lithography processing steps to form the openings 902(1), 902(2). As shown in FIG. 9B, the BARC layer 904(1) is disposed such that a respective over-coating portion 906 extends above the hard mask 800 a distance $D_3$ in this example. The photoresist layer 900 is then disposed over the BARC layer 904(1), 904(2) to subsequently be exposed to form the openings 902(1), 902(2) as discussed above, for the subsequent step of forming the via opening 224(1) and adjacent via opening 224(2).

Figures 10A, 10B:
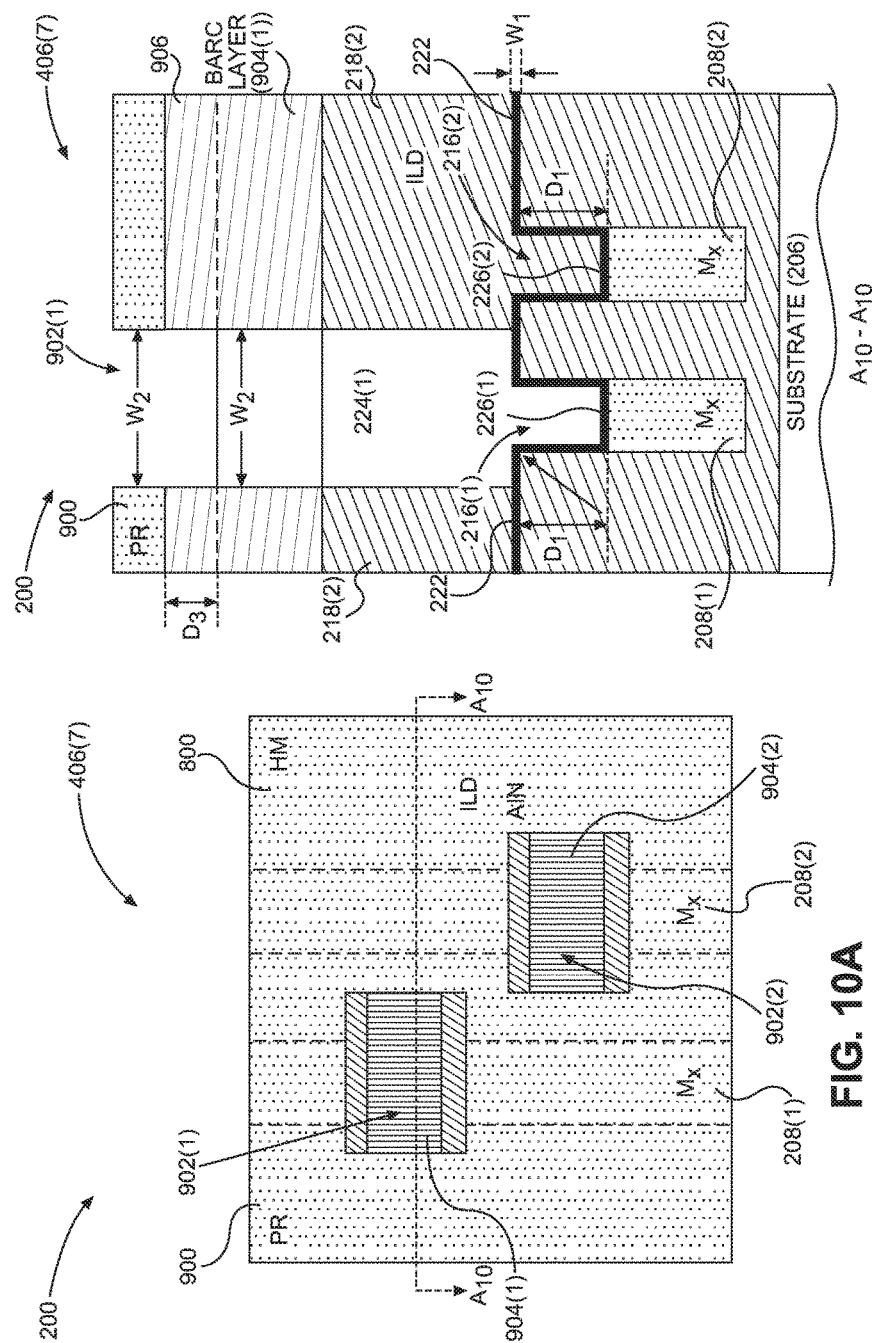
FIGS. 10A and 10B are top and cross-sectional side views, respectively, of a fabrication process of etching the via opening in the photoresist layer in FIGS. 9A and 9B down to a bottom surface of the recess area.

FIG. 10A is a top view of a next stage semiconductor die 406(7) of the interconnect structure 200 of a next fabrication process performed on the semiconductor die 406(6) in FIGS. 9A and 9B of providing the via opening 224(1) and adjacent via opening 224(2) for the self-aligned vias 212(1), 212(2) (FIG. 2B). FIG. 10B is a side cross-sectional view of the semiconductor die 406(7) in FIG. 10A along the $A_{10}$-$A_{10}$ line in FIG. 10A. As illustrated in FIGS. 10B, the via opening 224(1) of via opening width $W_2$ is formed aligned with the underlying metal line 208(1) among the plurality of underlying metal lines 208(1), 208(2) (and in the photoresist layer 900 if provided) (block 312 in FIG. 3B). In this example, the via opening 224(1) is etched down through the BARC layer 904(1), the second dielectric layer 218(2), and down to the bottom surface 226(1) of the recess area 216(1) above the underlying metal line 208(1) down to the stop layer 222 (block 312 in FIG. 3B). In this manner, the via opening 224(1) is aligned with the underlying metal line 208(1) so that a self-aligned via 212(1) formed in the via opening 224(1) will be self-aligned with the underlying metal line 208(1) to avoid or reduce via misalignments with the underlying metal line 208(1).

FIG. 11A is a top view of a next stage semiconductor die 406(8) of the interconnect structure 200 of a next fabrication process performed on the semiconductor die 406(7) in FIGS. 10A and 10B with the photoresist layer 900 and the BARC layer 904(1), 904(2) removed and trench openings 1100(1), 1100(2) aligned with the via opening 224(1) and adjacent via opening 224(2) to facilitate fabrication of the self-aligned vias 212(1), 212(2) (FIG. 2B). FIG. 11B is a side cross-sectional view of the semiconductor die 406(8) in FIG. 11A along the $A_{11}$-$A_{11}$ line in FIG. 11A. As illustrated in FIG. 11B, the via opening 224(1) of via opening width $W_2$ was previously formed through the opening 902(1) in the photoresist layer 900 (block 312 in FIG. 3B). However, it is desired to prepare the via opening 224(1) to receive a conductive material to form the self-aligned via 212(1) interconnected with the underlying metal line 208(1). In this example, the stop layer 222 is removed from the recess area 216(1) so that a conductive material disposed in the via opening 224(1) is interconnected to the underlying metal line 208(1). If provided, the photoresist layer 900 and/or BARC layer 904(1) are removed before the trench opening 1100(1) is formed around the via opening 224(1). The trench opening 1100(1) is then formed around the via opening 224(1) and etched in this example (block 314 in FIG. 3B). The trench opening 1100(1) may be formed around the via opening 224(1) using the hard mask 800 if provided. The trench opening 1100(1) is aligned to the overlying metal line 210(1) using the hard mask 800.

Figures 12A, 12B:
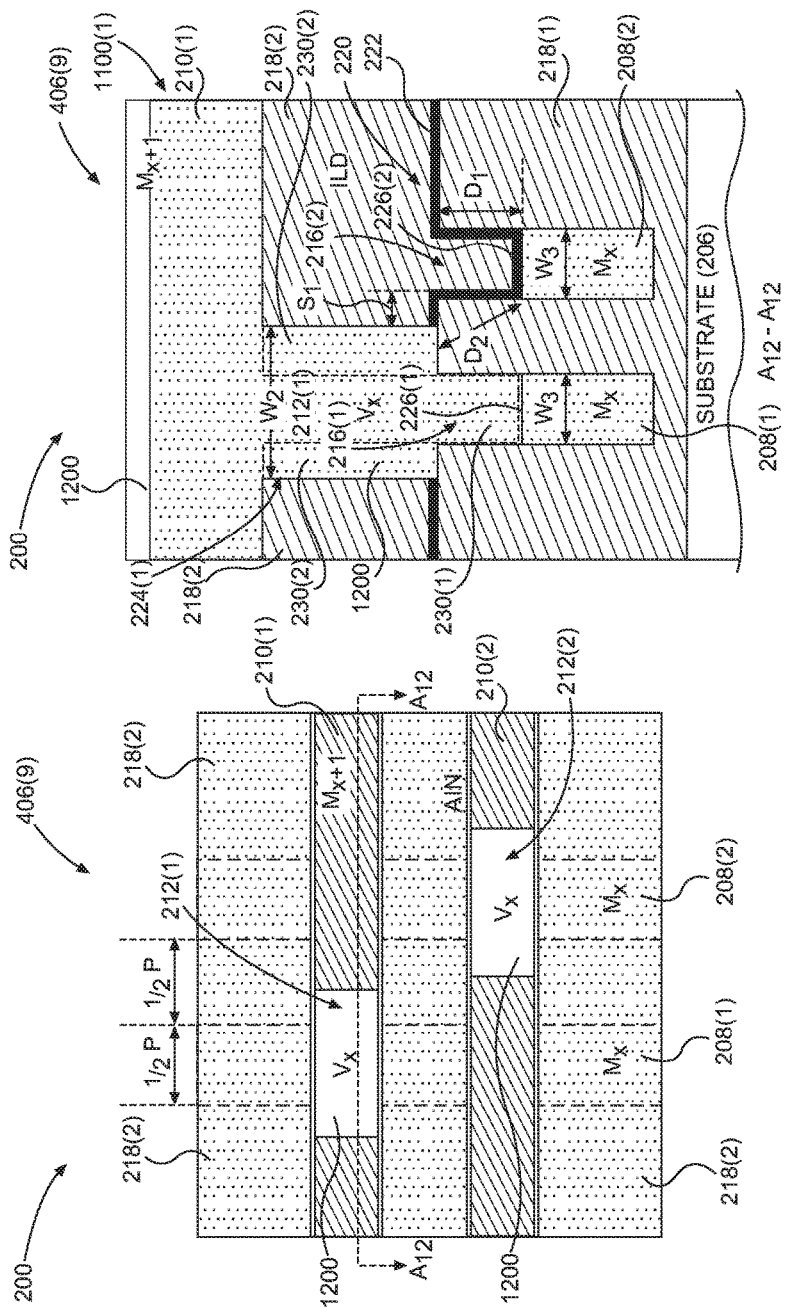
FIGS. 12A and 12B are top and cross-sectional side views, respectively, of a fabrication process of disposing a conductive material in the via opening and the trench opening in the semiconductor die in FIGS. 11A and 11B to form a self-aligned via with an underlying metal line and an overlying metal line aligned with the self-aligned via interconnecting the overlying metal line with the underlying metal line.

FIG. 12A is a top view of a next stage semiconductor die 406(9) of the interconnect structure 200 of a next fabrication process performed on the semiconductor die 406(8) in FIGS. 11A and 11B to fabricate the self-aligned vias 212(1), 212(2) in self-alignment with the respective overlying metal lines 210(1), 210(2) and underlying metal lines 208(1), 208(2). FIG. 12B is a side cross-sectional view of the semiconductor die 406(9) in FIG. 12A along the $A_{12}$-$A_{12}$ line in FIG. 12A. As illustrated in FIGS. 12B, the via opening 224(1) and trench opening 1100(1) are filled with a conductive material 1200 down to the bottom surface 226(1) of the recess area 216(1) to form the self-aligned via 212(1) (block 316 in FIG. 3B). In this manner, by the conductive material 1200 being disposed into the via opening 224(1) and the recess area 216(1) that is already aligned to the underlying metal line 208(1), the fabricated self-aligned via 212(1) is then self-aligned to the underlying metal line 208(1). The self-aligned via 212(1) is interconnected to the overlying metal line 210(1). Further, by the self-aligned via 212(1) being formed from the conductive material 1200 filled in the trench opening 1100(1), the overlying metal line 210(1) is formed. As an example, a dual damascene process may be used to perform the filling process of the trench opening 1100(1) and via opening 224(1) to form the self-aligned via 212(1). The conductive material 1200 used to fill the trench opening 1100(1) and via opening 224(1) in the semiconductor die 406(9) in FIGS. 12A and 12B to form the self-aligned via 212(1) and the overlying metal line 210(1) can be provided as any conductive material 1200, including a metal material such as Copper (Cu). However, as discussed above, non-Copper (Cu) metals such as Cobalt (Co), Ruthenium (Ru), and Aluminum (Al) as examples, may be advantageous to be used as they are easier materials to be etched back, and are better able to be filled in the high aspect ratio via opening 224(1) and the trench opening 1100(1).

Further, as shown in FIG. 12B, the via opening width $W_2$ of the via opening 224(1) is formed larger than the recess width $W_3$ of the recess area 216(1) in this example, allowing the self-aligned via 212(1) to extend beyond and outside the recess width $W_3$ of the recess area 216(1). The first via portion 230(1) of the self-aligned via 212(1) extends into the recess area 216(1) of the underlying metal line 208(1) to electrically interconnect the underlying metal line 208(1) to the overlying metal line 210(1). The second via portion 230(2) of the self-aligned via 212(1) extends outside of the recess area 216(1). This structure can provide for improved alignment of the self-aligned via 212(1) to the underlying metal line 208(1), because a greater tolerance is provided for fully disposing the self-aligned via 212(1) in the recess area 216(1) to provide contact with the top surface of the underlying metal line 208(1) given variations that may occur in the fabrication process. Thus, the fabrication process of disposing the self-aligned via 212(1) in the recess area 216(1) may be relaxed. However, extending the via opening 224(1) to the via opening width $W_2$ beyond the recess width $W_3$ of the recess area 216(1) can place the self-aligned via 212(1) formed in the recess area 216(1) closer to an adjacent underlying metal line 208(2). This can risk creating a via-metal short between the self-aligned via 212(1) and the adjacent underlying metal line 208(2).

Thus, as further shown in FIG. 12B, in this example, an adjacent recess area 216(2) is formed in an adjacent underlying metal line 208(2) adjacent to the underlying metal line 208(1) to reduce the risk of a via-metal short between the self-aligned via 212(1) and the adjacent underlying metal line 208(2). Providing the adjacent recess area 216(2) in the adjacent underlying metal line 208(2) provides a greater distance $D_2$ between the self-aligned via 212(1) and the adjacent underlying metal line 208(2) than if the adjacent recess area 216(2) were not created in the adjacent underlying metal line 208(2). For example, the recess width $W_3$ of the adjacent recess area 216(2) is the same as the recess width $W_3$ of the recess area 216(1) in this example, but such is not required. This may be particularly important to scale down the metal pitch P in an interconnect structure, such as the interconnect structure 200, beyond a five (5) nm technology node for example, where the interconnected metal lines are more closely located to adjacent metal lines where slight misalignment of the vias can cause via-metal shorts. This may allow the metal pitch P of the interconnect structure 200 to be further reduced without risking via-metal shorts. The lateral distance $S_1$ between the self-aligned via 212(1) and the adjacent underlying metal line 208(2) is no longer the controlling distance between the self-aligned via 212(1) and the adjacent underlying metal line 208(2) for a via-metal short. Providing the adjacent recess area 216(2) in the adjacent underlying metal line 208(2) may also allow the landing alignment margin of the via opening 224(1) to be relaxed during the fabrication process. This is because the lateral distance $S_1$ between the self-aligned via 212(1) and the adjacent underlying metal line 208(2) is no longer the controlling distance between the self-aligned via 212(1) and the adjacent underlying metal line 208(2) for a via-metal short.

The above examples of the fabrication steps for the self-aligned via 212(1) are also equally applicable for the self-aligned via 212(2), or any other self-aligned vias fabricated in the interconnect structure 200.

An IC including an interconnect structure that includes a self-aligned via(s) with an underlying metal line in a first metal layer to form an interconnection between the underlying metal line and an overlying metal line in an upper metal layer may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 13:
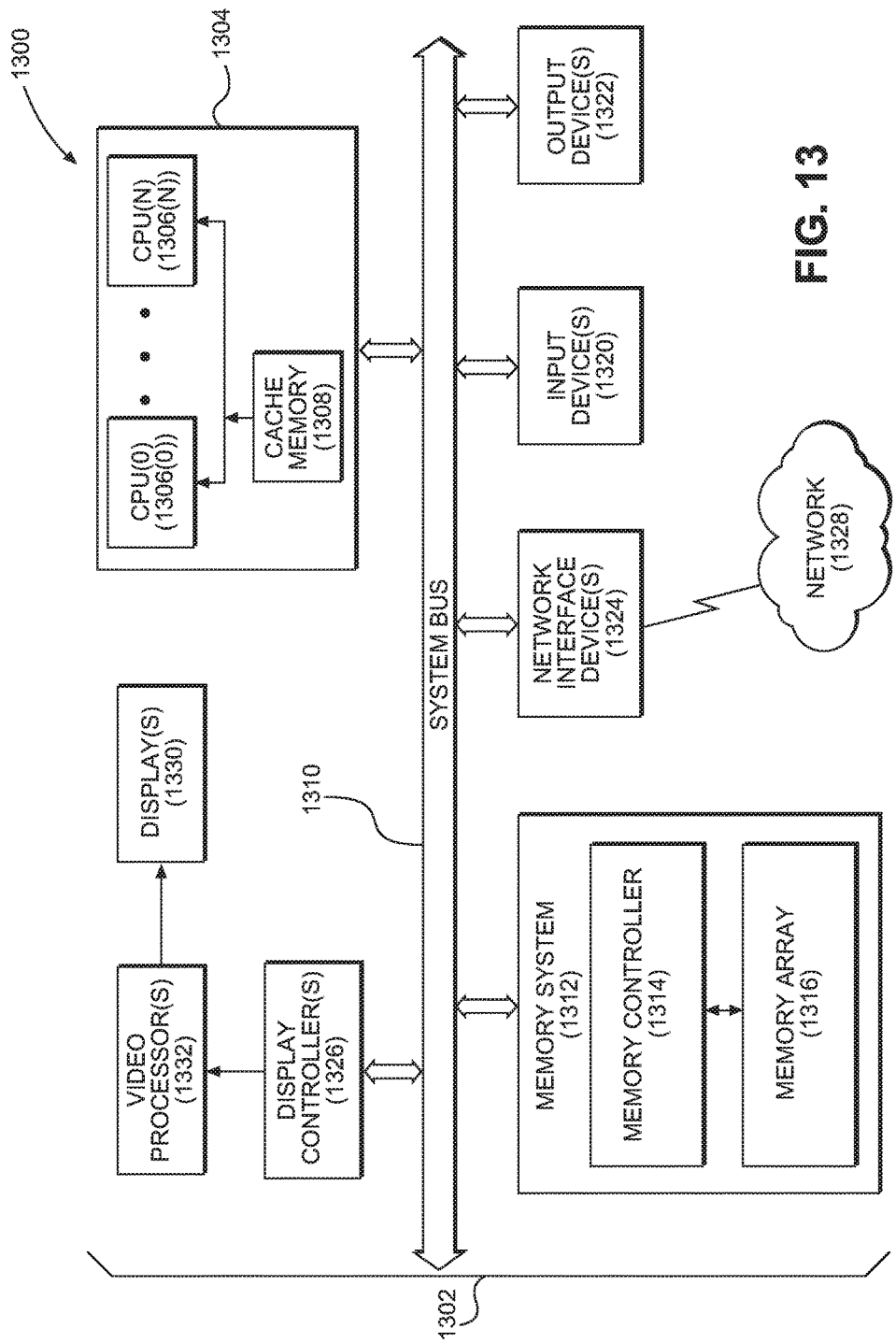
FIG. 13 is a block diagram of an exemplary processor-based system that can include ICs that include an interconnect structure that includes metal lines disposed in a plurality of metal layers, and includes a self-aligned via aligned to an underlying metal line and interconnecting the underlying metal line to an overlying metal line to form an interconnection in the ICs, including but not limited to the interconnect structure in FIGS. 2A and 2B.

In this regard, FIG. 13 illustrates an example of a processor-based system 1300 that can include ICs 1302 that can include an interconnect structure that includes a self-aligned via(s) with an underlying metal line in a first metal layer to form an interconnection between the underlying metal line and an overlying metal line in an upper metal layer. The ICs 1302 can be provided in any of the components in the processor-based system 1300. In this example, the processor-based system 1300 includes a processor 1304 that includes one or more CPUs 1306(0)-1306(N). The processor 1304 may have shared cache memory 1308 accessible by the CPU(s) 1306(0)-1306(N) for rapid access to temporarily stored data.

The processor 1304 is coupled to a system bus 1310 and can intercouple master and slave devices included in the processor-based system 1300. As is well known, the processor 1304 communicates with these other devices by exchanging address, control, and data information over the system bus 1310. Although not illustrated in FIG. 13, multiple system buses 1310 could be provided, wherein each system bus 1310 constitutes a different fabric. For example, the processor 1304 can communicate bus transaction requests to a memory system 1312 as an example of a slave device. The memory system 1312 may include a memory controller 1314 that controls access to a memory array 1316.

Other master and slave devices can be connected to the system bus 1310. As illustrated in FIG. 13, these devices can include the memory system 1312, one or more input devices 1320, one or more output devices 1322, one or more network interface devices 1324, and one or more display controllers 1326. The input device(s) 1320 can include any type of input device, including but not limited to input keys, switches, voice processors, etc. The output device(s) 1322 can include any type of output device, including but not limited to audio, video, other visual indicators, etc. The network interface device(s) 1324 can be any devices configured to allow exchange of data to and from a network 1328. The network 1328 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1324 can be configured to support any type of communications protocol desired.

The processor 1304 may also be configured to access the display controller(s) 1326 over the system bus 1310 to control information sent to one or more displays 1330. The display controller(s) 1326 sends information to the display(s) 1330 to be displayed via one or more video processors 1332, which process the information to be displayed into a format suitable for the display(s) 1330. The display(s) 1330 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An interconnect structure for an integrated circuit (IC), comprising: an underlying metal layer, comprising:
   a plurality of underlying metal lines disposed in a dielectric layer having a top surface, the plurality of underlying metal lines comprising an underlying metal line and an adjacent underlying metal line adjacent to the underlying metal line;
   a recess area of a recess width disposed in the dielectric layer below the top surface of the dielectric layer of a recess distance down to a top surface of the underlying metal line among the plurality of underlying metal lines;
   an adjacent recess area having an adjacent recess area width defined by a first side surface to a second side surface of the adjacent recess area disposed in the dielectric layer below the top surface of the dielectric layer of the recess distance down to a top surface of the adjacent underlying metal line; and
   an etch stop layer disposed in the adjacent recess area on the top surface of the adjacent underlying metal line and on the first and the second side surfaces of the adjacent recess area forming a cavity in the adjacent recess area having a cavity width less than the adjacent recess area width, wherein a portion of the etch stop layer is disposed on the top surface of the dielectric layer, the etch stop layer comprises a semiconductor;
   an overlying metal layer disposed above the underlying metal layer, the overlying metal layer comprising a plurality of overlying metal lines;
   a second dielectric layer comprising:
   a first dielectric material portion disposed below the top surface of the dielectric layer and in the cavity of the adjacent recess area; and
   a second dielectric material portion disposed between the overlying metal layer and the portion of the etch stop layer disposed on the top surface of the dielectric layer; and
   a self-aligned via of a via opening width disposed through the second dielectric layer between the underlying metal layer and the overlying metal layer and electrically interconnecting the underlying metal line to an overlying metal line among the plurality of overlying metal lines, wherein the self-aligned via comprises:
   a first via portion of the self-aligned via extending into the recess area of the underlying metal line to be self-aligned with the underlying metal line; and
   a second via portion of the self-aligned via extending outside of the recess area of the via opening width.

2. The interconnect structure of claim 1, wherein the second via portion of the self-aligned via has a width greater than the recess width of the recess area.

3. The interconnect structure of claim 1, wherein the adjacent recess area is formed by removal of a portion of the adjacent underlying metal line below the top surface of the dielectric layer of the recess distance.

4. The interconnect structure of claim 1, wherein the recess distance of the adjacent underlying metal line is at least approximately one-half (½) of a metal pitch of the plurality of underlying metal lines.

5. The interconnect structure of claim 1, wherein the recess area is formed by removal of a portion of the underlying metal line below the top surface of the dielectric layer of the recess distance.

6. The interconnect structure of claim 1, wherein the recess distance of the underlying metal line is at least approximately one-half (½) of a metal pitch of the plurality of underlying metal lines.

7. The interconnect structure of claim 1, wherein the plurality of underlying metal lines are formed from a metal material selected from the group consisting of Cobalt (Co), Ruthenium (Ru), and Aluminum (Al).

8. The interconnect structure of claim 1, wherein a metal pitch of the plurality of underlying metal lines is less than or equal to fifty-six (56) nanometers (nm).

9. The interconnect structure of claim 1, wherein a metal pitch of the plurality of underlying metal lines is less than or equal to twenty-eight (28) nanometers (nm).

10. The interconnect structure of claim 1, wherein a metal pitch of the plurality of underlying metal lines is less than or equal to five (5) nanometers (nm).

11. The interconnect structure of claim 1, wherein the etch stop layer is comprised of Aluminum Nitride (AlN).

12. The interconnect structure of claim 1, wherein a thickness of the etch stop layer is less than or equal to two (2) nanometers (nm).

13. The interconnect structure of claim 1 integrated into the IC.

14. The interconnect structure of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

* * * * *